US008539905B2

(12) United States Patent
Cady et al.

(10) Patent No.: US 8,539,905 B2
(45) Date of Patent: Sep. 24, 2013

(54) POLYMERIC MICRO-CANTILEVERS FOR ULTRA-LOW VOLUME FLUID AND LIVING CELL DEPOSITION

(75) Inventors: Nathaniel C. Cady, Delmar, NY (US); Magnus Bergkvist, Albany, NY (US); Alison Gracias, Albany, NY (US)

(73) Assignee: The Research Foundation For The State University of New York, Albany, NY (US)

(*) Notice: Subject to any disclaimer, the term of this patent is extended or adjusted under 35 U.S.C. 154(b) by 592 days.

(21) Appl. No.: 12/613,258

(22) Filed: Nov. 5, 2009

(65) Prior Publication Data

US 2010/0119711 A1    May 13, 2010

Related U.S. Application Data

(60) Provisional application No. 61/112,316, filed on Nov. 7, 2008.

(51) Int. Cl.
*B05C 5/00* (2006.01)
*B05C 3/00* (2006.01)
*B01L 3/02* (2006.01)

(52) U.S. Cl.
USPC ........ 118/300; 118/401; 422/501; 435/307.1; 435/4

(58) Field of Classification Search
USPC .............. 118/300, 401; 401/137, 138, 145, 401/253, 286; 422/511, 101, 102, 500–504, 422/507, 508, 551; 141/31; 239/601; 436/180; 427/2.1
See application file for complete search history.

(56) References Cited

U.S. PATENT DOCUMENTS

| | | | |
|---|---|---|---|
| 5,512,374 A | 4/1996 | Wallace et al. | 428/422 |
| 5,807,522 A | 9/1998 | Brown et al. | 422/50 |
| 6,231,177 B1 | 5/2001 | Cherukuri et al. | 347/105 |
| 6,291,140 B1 | 9/2001 | Andreoli et al. | 430/322 |
| 6,568,799 B1 | 5/2003 | Yang et al. | 347/85 |
| 6,594,432 B2 | 7/2003 | Chen et al. | 385/133 |
| 6,953,519 B2 | 10/2005 | Shirakawabe et al. | 204/192.32 |
| 6,959,471 B2 | 11/2005 | Temple et al. | 29/25.35 |
| 6,998,689 B2 | 2/2006 | Kley | 257/414 |
| 7,051,654 B2 | 5/2006 | Boland et al. | 101/483 |
| 7,281,419 B2 | 10/2007 | Wang et al. | 73/105 |
| 7,282,329 B2 | 10/2007 | Manalis et al. | 435/6 |
| 7,288,404 B2 | 10/2007 | Vafai et al. | 435/287.1 |
| 2002/0094304 A1 | 7/2002 | Yang et al. | 422/100 |

(Continued)

OTHER PUBLICATIONS

Gracias, A. et al., "Novel Microfabrication Approach of Embedded SU8 Fluidic Networks for Cell Transport on Chips", J. Microlith. Microfab. Microsyst. 5(2), 2006, pp. 021102/1-021102/7.

J. M. Köhler et al., "Micromechanical elements for detection of molecules and molecular design", Microsystem Technologies, Springer-Verlag, pp. 202-208, 1995.

(Continued)

*Primary Examiner* — Yewebdar Tadesse
(74) *Attorney, Agent, or Firm* — Heslin Rothenberg Farley & Mesiti P.C.

(57) ABSTRACT

Polymer-based micro-cantilevers for depositing material onto a surface include, in one embodiment, a body portion, an elongated beam portion sized smaller than and extending from the body portion and having a length greater than about 500 microns. The body portion includes a reservoir and the elongated beam portion having a passageway disposed therein. The passageway has an inlet opening in fluid communication with the reservoir and an outlet opening at a distal end of the elongated beam portion. The passageway comprises a width greater than 10 microns to about 100 microns, and a height of about 25 microns to about 100 microns. Methods for delivering fluid and living cells using the polymer-based micro-cantilevers are also disclosed.

44 Claims, 16 Drawing Sheets

(56) References Cited

U.S. PATENT DOCUMENTS

| | | | |
|---|---|---|---|
| 2003/0054355 A1 | 3/2003 | Warthoe | 435/6 |
| 2003/0148539 A1 | 8/2003 | Van Dam et al. | 436/180 |
| 2005/0236566 A1 | 10/2005 | Liu | 250/306 |
| 2005/0266149 A1 | 12/2005 | Henderson et al. | 427/2.11 |
| 2006/0075803 A1 | 4/2006 | Boisen et al. | 73/31.06 |
| 2007/0035587 A1 | 2/2007 | Lee et al. | 347/55 |
| 2007/0287185 A1 | 12/2007 | Vafai et al. | 436/63 |
| 2008/0173667 A1 | 7/2008 | Daniel et al. | 222/1 |
| 2008/0236745 A1 | 10/2008 | Guha et al. | 156/345.11 |
| 2008/0286751 A1 | 11/2008 | Renaud et al. | 435/5 |

OTHER PUBLICATIONS

A. Gracias, N. Tokranova, and J. Castracane "SU-8-based static diffractive optical elements: wafer-level integration with VCSEL arrays", Proceedings of SPIE, vol. 6899, 2008, pp. 68990J/1-68990J/9.

A. Gracias, B. Xu, J. Castracane, "Fabrication of 3-D microchannels using SU-8", Proceedings of the 7th Annual International Conference on Micromechanical Systems (TEXMEMS), 2005, El Paso-Juarez Region.

X. Feng, B.G. Szaro, A. Gracias, S. Baselmans, N. Tokranova, B. Xu and J. Castracane, "Microfabricated devices for bio-applications", Proceedings of SPIE, vol. 5718, 2005, pp. 13-21.

POLYMERIC MICRO-CANTILEVERS FOR ULTRA-LOW VOLUME FLUID AND LIVING CELL DEPOSITION

CROSS-REFERENCE TO RELATED APPLICATION

This application claims the benefit of U.S. Provisional Application No. 61/112,316, filed Nov. 7, 2008, entitled "Polymeric Micro-Cantilevers For Ultra-Low Volume Fluid And Living Cell Deposition", which application is incorporated in its entirety herein by reference.

TECHNICAL FIELD

This invention relates generally to deposition of materials on a surface, and more specifically to polymer-based micro-cantilevers for ultra-low volume fluid and living cell deposition.

BACKGROUND

Micro-cantilevers have been used for a variety of nano and microscale printing techniques including dip-pen nanolithography (DPN) and grooved cantilever-based microprinting.

U.S. Patent Application Publication No. 2005/0266149 by Henderson et al. discloses an apparatus and method for depositing material onto a surface in which the material is deposited upon a surface from an elongated beam having an aperture defined therein through which the material is moved by passive adsorption. The elongated beam can be substantially planar along substantially its entire length, can be oriented at an acute angle with respect to the surface during deposition processes, and can have a length no greater than about 2 mm. In some embodiments, the aperture can be elongated, can extend from a material reservoir to a location short of the terminal end of the elongated beam or through the terminal end of the elongated beam, and can have a portion extending through the thickness of the elongated beam. The entire subject matter of U.S. Patent Application Publication No. 2005/0266149, is incorporated herein by reference.

Gracias et al., in "Novel Microfabrication Approach Of Embedded SU8 Fluidic Networks For Cell Transport On Chips" J. Microlith. Microfab. Microsyst. 5(2), 2006, 021102 focused on the development and fabrication SU8-based microchannel networks, which can be integrated into microdevices for fast drug delivery and cell transport on chips. Instead of using sacrificial materials or wafer bonding, single-and double-layered SU8 channels on silicon substrates were achieved, as well as integration of the SU8 channels with microelectrode arrays. A series of cell transport experiments were performed on these devices.

J. M. Köhler et al., in "Micromechanical elements for detection of molecules and molecular design", Microsystem Technologies, Springer-Verlag, pp. 202-208, 1995, (the entire contents of which are incorporated herein by reference), discloses a polymer-based scanning force microscopy (SFM) sensor for the measurement of thin film roughness and the detection of holes in molecular films as well as in the detection of single DNA molecules. In SFM, a flexible cantilever with a sharp stylus at its end is scanned over the sample surface. The atomic interaction with the tip causes a bending of the cantilever. The bending is normally detected by the deflection of a laser beam on the backside of the flexible lever (contact mode SFM).

There is a need for further micro-cantilevers for ultra-low volume fluid and living cell deposition.

SUMMARY

In a first aspect, the present invention provides a device for depositing material onto a surface. The device includes a body portion, and an elongated beam portion sized smaller than and extending from the body portion. The elongated beam comprises a length greater than about 500 microns. The body portion has a reservoir disposed in the body portion, and the elongated beam portion has a passageway disposed therein. The passageway has an inlet opening in fluid communication with the reservoir and an outlet opening at a distal end of the elongated beam portion. The passageway comprises a width greater than 10 microns to about 100 microns, and a height of about 25 microns to about 100 microns.

In a second aspect, the present invention provides a device for depositing material onto a surface. The device includes a body portion, and an elongated beam portion sized smaller than and extending from the body portion. The body portion and the elongated beam portion comprise a thickness of between about 50 microns to about 200 microns, and the elongated beam comprises a length greater than about 500 microns. The body portion has a reservoir disposed in the body portion. The elongated beam portion has a passageway disposed therein having an inlet opening in fluid communication with the reservoir and an outlet opening at a distal end of the elongated beam portion. The passageway comprises a width greater than 10 microns to about 100 microns, and a height of about 25 microns to about 100 microns, and the passageway is closed between the inlet opening and the outlet opening for transporting fluid from the reservoir to the distal end of the elongated beam. A projecting portion extends outwardly from the distal end. The body portion and the elongated beam portion comprise a polymeric material.

In a third aspect, the present invention provides a method for delivering a fluid to a surface. The method includes providing the device as noted above, introducing the fluid into the reservoir of the device, transferring fluid through the passageway from the reservoir to the distal end of the elongated beam portion, and depositing the fluid from the distal end of the elongated beam to the surface.

In a fourth aspect, the present invention provides a method for delivering living cells to a surface. The method includes providing the device noted above, depositing the cells into the reservoir of the device, transferring the cells through the passageway from the reservoir to the distal end of the elongated beam portion, and depositing the cells from the distal end of the elongated beam to the surface.

In a fifth aspect, the present invention provides a method for delivering fluid to a surface. The method includes providing an elongated beam having a passageway therein, transferring the fluid through the passageway to an outlet opening in the distal end of the elongated beam, and depositing the fluid from the distal end of the elongated beam to the surface to provide a plurality of droplets having a diameter of between about 20 microns to about 100 microns.

In a sixth aspect, the present invention provides a method for forming a polymer-based micro-cantilever operable to deliver at least one of fluid and cells to a surface. The method includes providing a substrate, depositing a release layer on the substrate, depositing a first polymeric layer on a substrate, exposing the first polymeric layer to a light source to define a base of a body portion, an elongated beam portion having a smaller size compared to the body, and a projection portion, depositing a second polymeric layer on the first polymeric layer, exposing the second polymeric layer to the light source to define an upper portion of the body having a reservoir, and a plurality of spaced-apart walls along the elongated beam portion extending from the body portion and terminating at a proximal end of the projection portion, and a passageway extending from the reservoir between the spaced-apart walls to the projection portion, developing the second polymeric layer to dissolve the unexposed portions of the polymeric layers, and wherein the elongated beam portion is sized smaller than and extending from the body portion, the elongated beam comprising a length greater than about 500 microns, and the passageway comprising a width greater than 10 microns to about 100 microns, and a height of about 25 microns to about 100 microns.

BRIEF DESCRIPTION OF THE DRAWINGS

The subject matter which is regarded as the invention is particularly pointed out and distinctly claimed in the concluding portion of the specification. The invention, however, may best be understood by reference to the following detailed description of various embodiments and the accompanying drawings in which:

DETAILED DESCRIPTION

The present invention is directed to grooved micro-cantilever designs by creating micro-cantilevers for deposition from polymeric materials which are easier to fabricate than traditional silicon-based cantilevers, are cheaper to produce, and have inherent surface properties that are more amenable to the printing/deposition process. For example, the present invention is directed to micro-cantilevers created from multiple thermoset, thermoplastic and/or UV-curable polymers which are attached to a bulk polymeric structure that contains a fluid reservoir for holding the printing fluid and a grooved channel that runs the length of the cantilever and intersects with the reservoir. The advantages of polymer-based micro-cantilevers over traditional silicon-based cantilevers are their ease of fabrication and the possibility to tune their chemical compatibility and surface interaction with the various fluids to be printed.

To print water-based fluids using grooved micro-cantilever technologies, silicon micro-cantilevers must be treated with ultraviolet light, ozone, or oxygen plasma to increase their hydrophilic nature (i.e., their ability to favorably interact with water). Polymeric grooved micro-cantilevers fabricated from SU8 polymer in accordance with the present invention require minimal surface pre-treatment prior to printing water-based fluids. In addition, SU8-based grooved micro-cantilevers have been used to print living cells onto surfaces, something that has not been possible with silicon-based micro-cantilevers.

Furthermore, the present invention is directed to polymeric grooved micro-cantilevers that may be covered with a capping structure that creates an enclosed fluidic channel that can enhance fluid manipulation and deposition as described in greater detail below. From the following description, it will be appreciated that suitable polymeric materials may be employed in the polymeric micro-cantilevers of the present invention.

Figure 1:
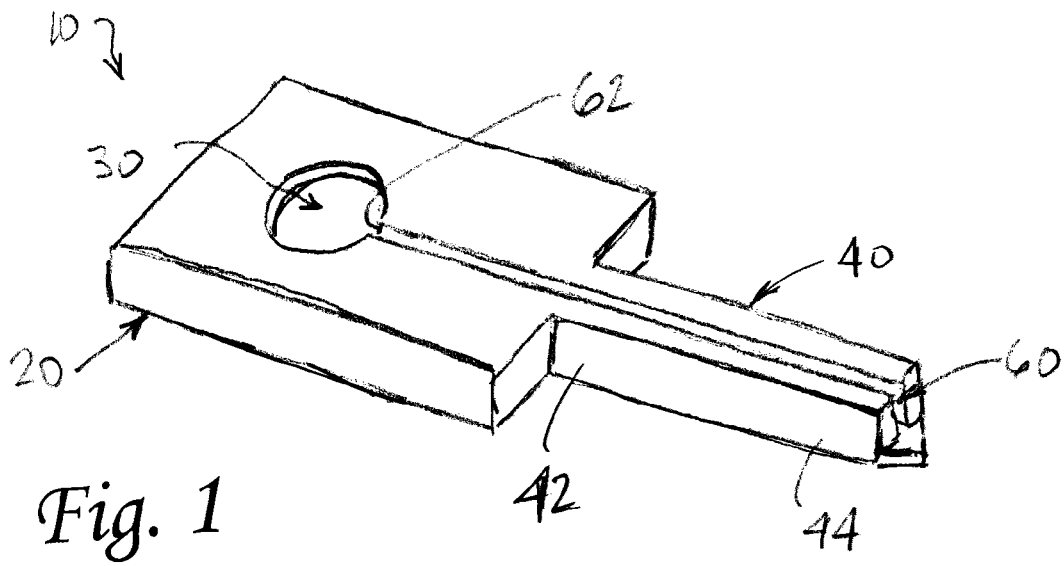
FIG. 1 is a perspective view of one embodiment of a polymer-based micro-cantilever having an open passageway or channel for ultra-low volume fluid and cell deposition in accordance with the present invention.
Figure 2:
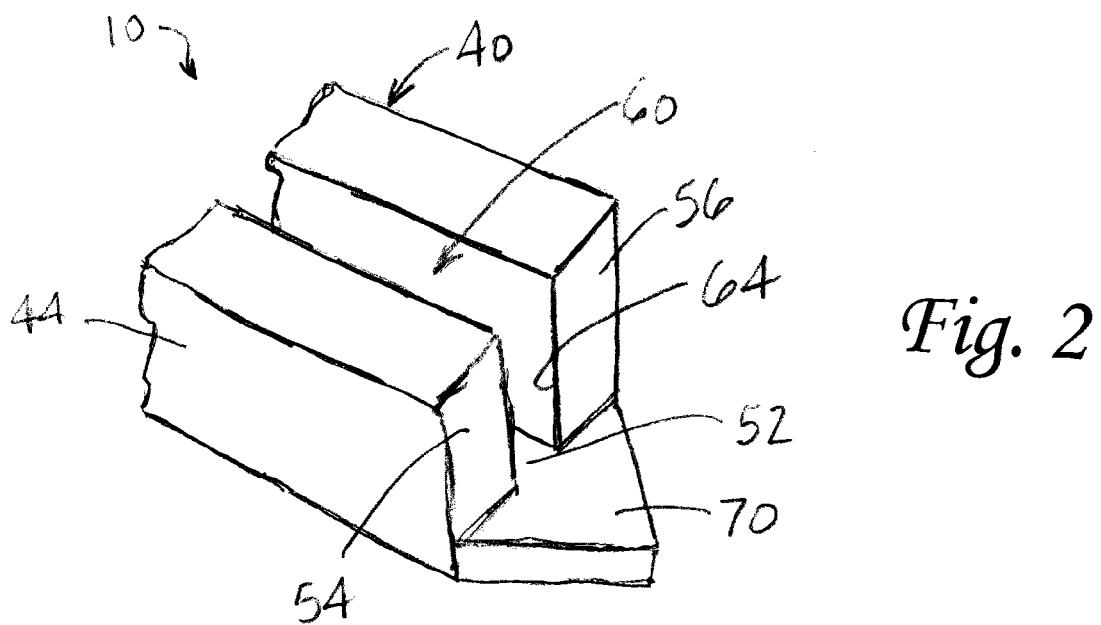
FIG. 2 is an enlarged perspective view of the distal end of the elongated beam of the polymer-based micro-cantilever of FIG. 1.

FIGS. 1 and 2 illustrate one embodiment of a polymer-based micro-cantilever 10, having an open passageway for depositing material onto a surface, in accordance with the present invention. In this exemplary embodiment, polymer-based micro-cantilever 10 may include a body portion 20 (FIG. 1), an elongated beam portion 40 sized smaller than and extending from body portion 20. Body portion 20 includes a reservoir 30 (FIG. 1) disposed in and defined by body portion 20. As described in greater detail below, the body portion and the elongated beam portion may be formed from suitable polymeric materials.

Elongated beam portion 40 includes a passageway 60 disposed therein. Passageway 60 has an inlet opening 62 (FIG. 1) disposed adjacent to reservoir 30 which is in fluid communication with reservoir 30 and an outlet opening 64 (FIG. 2) at a distal end 44 of elongated beam portion 40.

Passageway 60 is open, for example along the top of, between inlet opening 62 (FIG. 1) and outlet opening 64 (FIG. 2) forming an open passageway or channel for transporting fluid from reservoir 30 (FIG. 1) through the body and a proximal end 42 (FIG. 1) of elongated beam 40 to distal end 44 of elongated beam 40.

With reference to FIG. 2, elongated beam 40 may comprise a bottom wall 52, a first sidewall 54, and a second sidewall 56.

The sidewalls may have a thickness of between about 20 microns and about 100 microns. A projecting portion 70 may extend outwardly from distal end 44. The projecting portion may comprise a triangular shape. It will be appreciated that other shapes may be suitably employed. For example, the projecting portion may have a semi-circular shape or other shape.

The body portion and the elongated beam portion may comprise a thickness of between about 50 microns to about 200 microns, and the elongated beam may comprise a length greater than about 500 microns. The passageway may comprise a width greater than 10 microns to about 100 microns, and a height of about 25 microns to about 100 microns. In other embodiments, the passageway may comprise a width of between about 40 microns and 60 microns, and a height of between about 40 microns and 60 microns. In still other embodiments, the passageway may comprise a width of greater than 50 microns to about 100 microns, and a height of greater than 50 microns to about 100 microns. In further embodiments, the elongated beam may comprise a length greater than 2,000 microns, or a length greater than about 3,000 microns.

For example, the polymer-based micro-cantilever may be fabricated using a number of methods. A first method may include photolithographic patterning of SU8 photoresist (an epoxy-based, negative photoresist manufactured and available from Microchem Inc., Newton, Mass.). A second method may include liquid molding of polyurethane in silicone rubber molds. Both fabrication techniques result in the creation of polymer-based micro-cantilevers that can contain a grooved channel within the cantilever. The polymer-based micro cantilevers can be manufactured in a wide range of sizes. In addition, other methods for forming the polymer-based micro-cantilevers in accordance with the present invention may be employed.

Fabrication of polymer-based micro-cantilevers in accordance with the present invention, may be about 50 to about 200 microns thick, about 100 to about 200 microns wide, and about 500 to about 2000 microns long. The channels formed in these cantilevers may be about 25 to about 100 microns wide and about 25 to about 100 microns deep or high. The channels may be connected to a fluid reservoir that is about 2 mm in diameter and about 25 to about 100 microns deep.

For example, a process or method for creating channels in SU8 cantilevers may employ the following steps:
1. Spin coat Omnicoat (as release layer) on substrate. Softbake to cure layer.
2. Spin coat thin layer of SU8 (SU8 25) and soft bake to cure.
3. Expose layer with mask defining the base of the cantilever. Post exposure bake to crosslink the SU8 film.
4. Spin on a thicker layer of SU8 (SU8 50/100) and soft bake to cure.
5. Expose layer to define the channel walls. Post exposure bake to crosslink the layer. Note that the unexposed material is still sensitive to light.
6. Develop final structure in SU8 developer and release from substrate.

Figure 3:
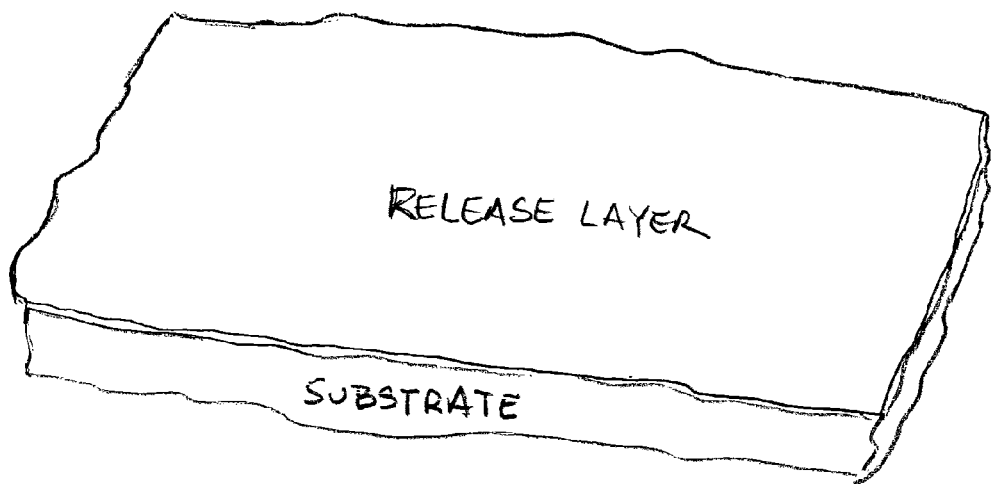
FIGS. 3-8 are perspective views of the process steps for forming the polymer-based micro-cantilever of FIG. 1 having an open passageway or channel.

For example, a substrate may include a 200-mm silicon wafer <100> which is cleaned in a mixture of hydrogen peroxide and sulfuric acid (volume ratio 1:3) for 2 min, followed by a thorough rinse of deionized (DI) water and blow dry. The substrate is then treated with a release layer or coat such as a spun coated Omnicoat, and softbaked to cure the release layer as shown in FIG. 3.

Figure 4:
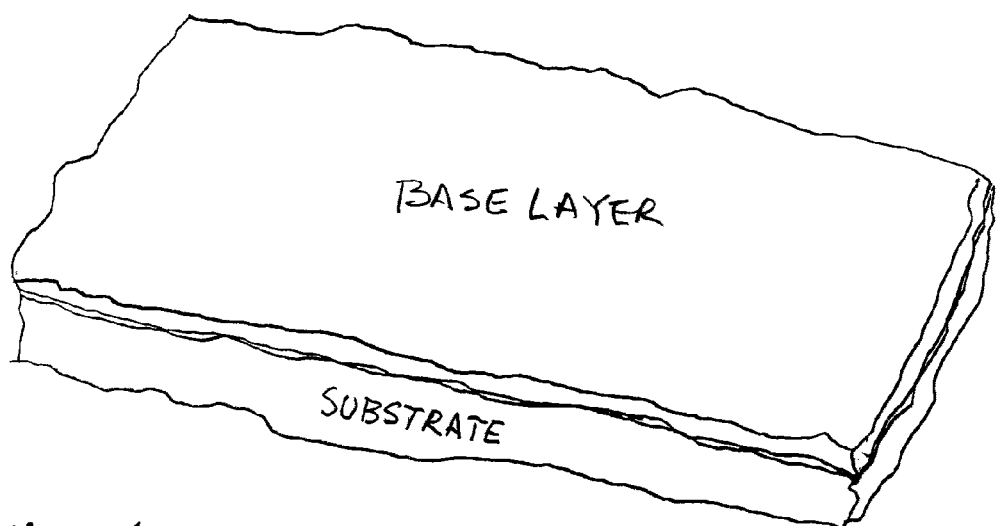

With reference to FIG. 4, a first polymer layer or base layer is deposited. For example, about a 20 to 50 μm SU8 film is spun coated on to the release layer, which is subsequently soft baked in a two-step process, with a final bake temperature of about 95° C. for 30 minutes to drive off any residual solvents. The SU8 film forms the base of the polymer-based micro-cantilever.

Figure 5:
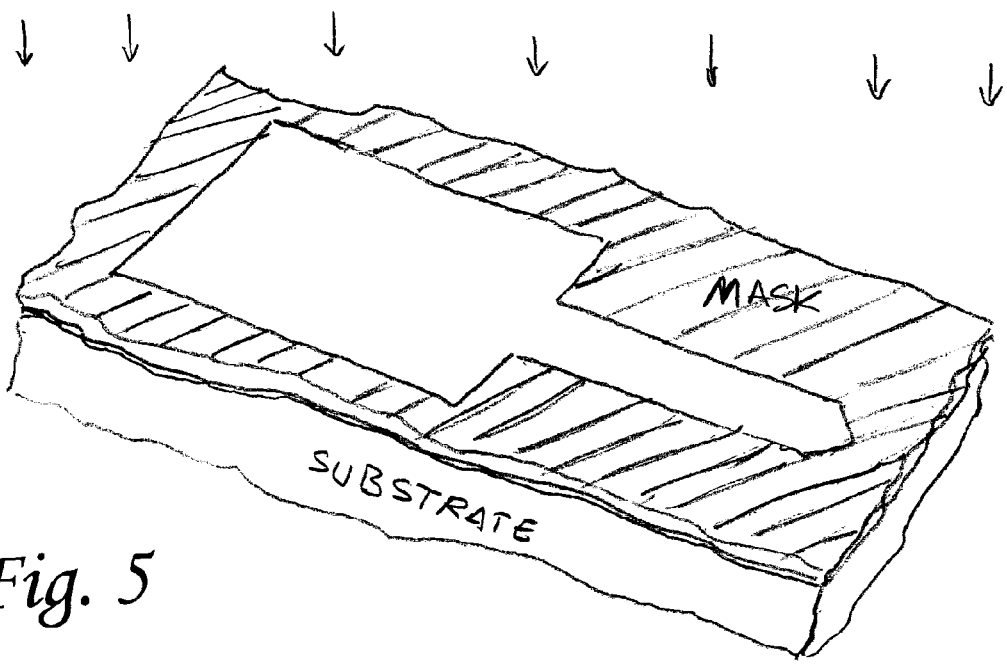

Using a mask having an opening defining the shape of the base of the polymer-based micro-cantilever, as shown in FIG. 5, the SU8 film is exposed (about 500 mJ/cm$^2$) to define the shape of the base, then postexposure baked using a two-step process, with a final bake of 95° C. for 35 min with a natural cool down. This process cross-links the field defining the base while leaving the SU8 outside the base unexposed and uncross-linked.

Figure 6:
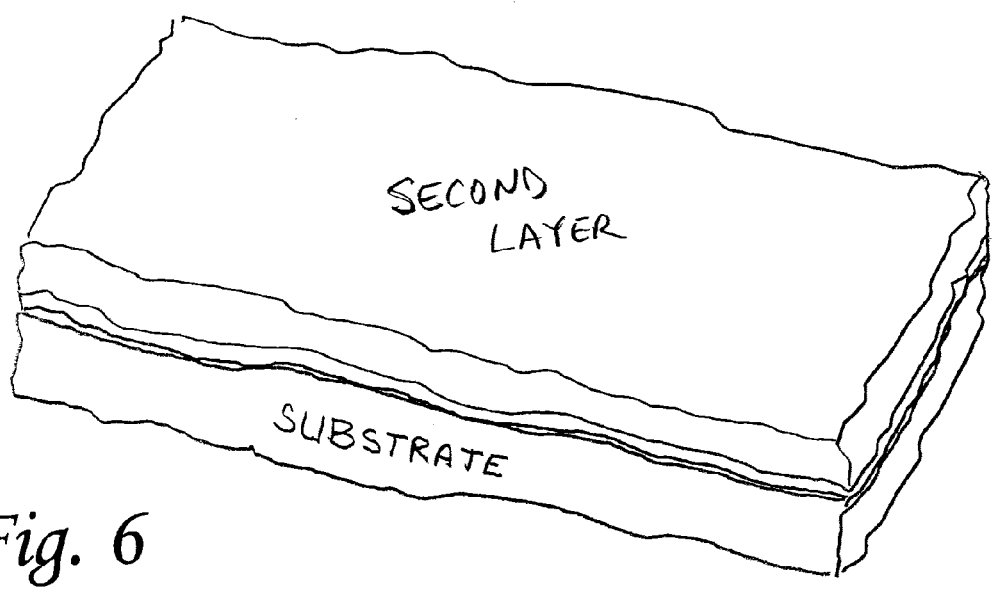

A second polymer layer is deposited onto the first polymer layer as shown in FIG. 6. For example, a second 100 μm SU8 polymer layer is spun coated onto the base layer, and soft baked.

Figure 7:
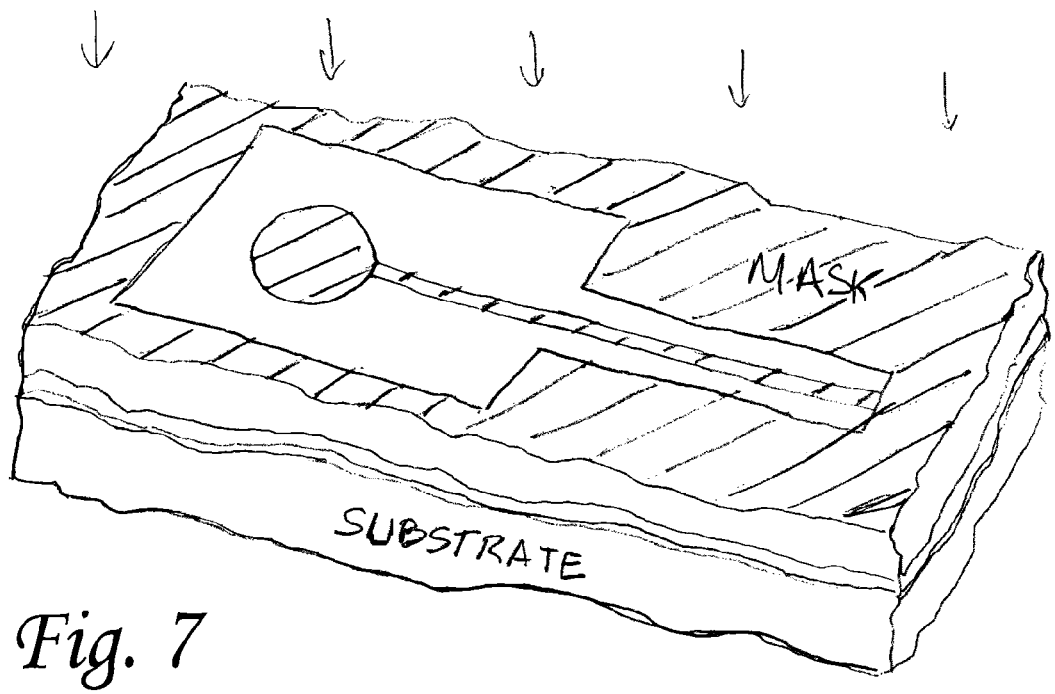

Using a mask having an opening defining the shape of the base of the polymer-based micro-cantilever and defining the reservoir and passageway, as shown in FIG. 7, the second polymer layer is then exposed (about 500 mJ/cm$^2$) first to define the passageway and reservoir and postexposure baked in a two-step process, with a final bake at 95° C. for 35 minutes, cross-linking the field. Although the films have been exposed and baked a number of times, the channels and reservoir are still filled with unexposed and uncross-linked SU8.

Figure 8:
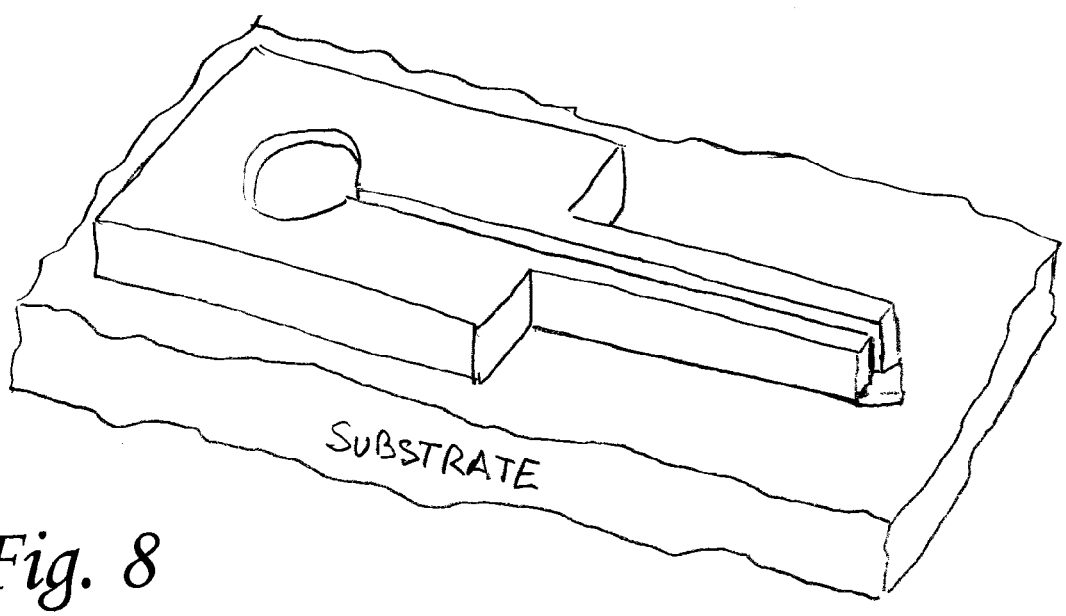

The next step of the process is to develop the layers in polygycol methyletheracetate (PGMEA), gently agitating the bath, dissolving the unexposed SU8 from inside the passageway and reservoir resulting in the polymer-based micro-cantilever disposed on the substrate as shown in FIG. 8. The polymer-based micro-cantilever may then be removed from the substrate. It will be appreciated that a plurality of polymer-based micro-cantilevers may be formed at the same time on the substrate as well as the body having a plurality of elongated beams extending therefrom.

Figure 9:
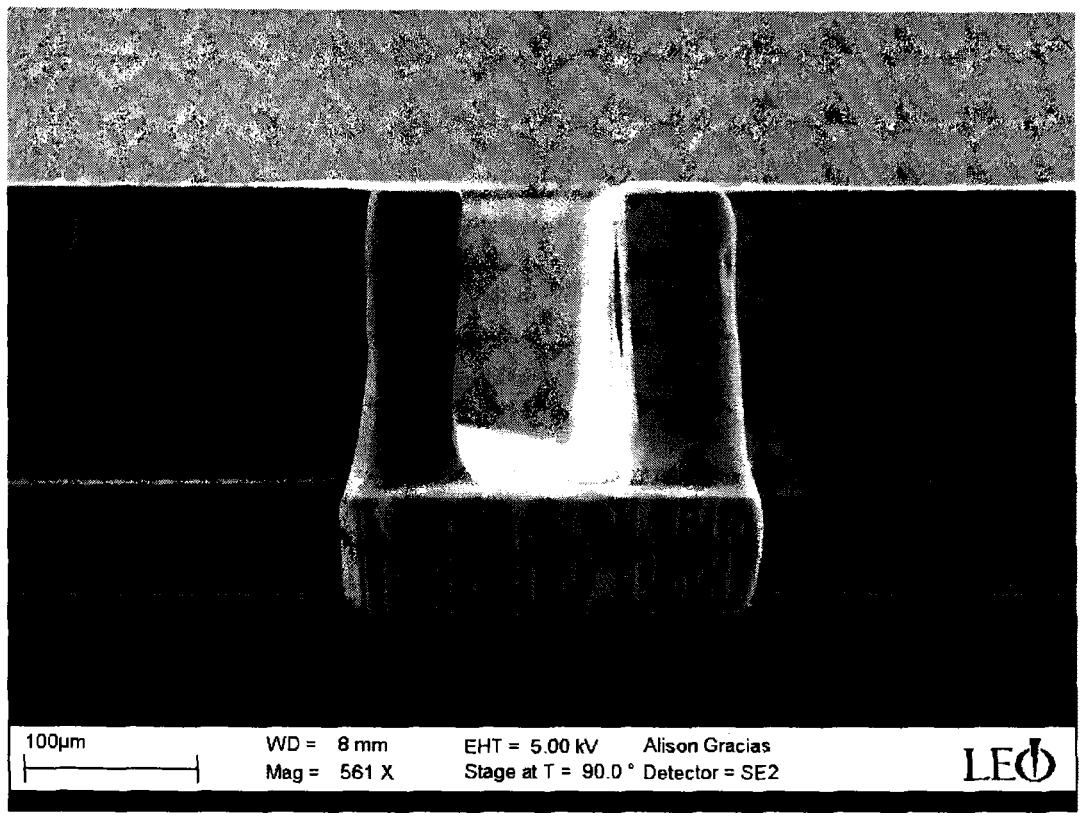
FIG. 9 is an image of the polymer-based micro-cantilever of FIG. 1 using scanning electron microscopy (SEM)

FIG. 9 is an image of the polymer-based micro-cantilever using scanning electron microscopy (SEM) looking down the fluid channel. The two layers of SU8 polymer used to form 1) the base and 2) the sidewalls of the cantilever can be seen.

In another embodiment of the present invention, the polymer-based micro-cantilevers may be enclosed with a capping layer to provide an enclosed fluid channel. This enables the manipulation of fluids within the micro-cantilever, which is advantageous for repeated usage, for cleaning the micro-cantilevers between uses, for enhanced fluid delivery from the micro-cantilevers, and for loading the cantilevers from the tip (rather than from the fluid reservoir). Enclosed micro-cantilevers may also have applications for the manipulation and placement of cells and other materials using fluid pressure and/or vacuum. For instance, a microfluidic connection could be made through the fluid access port and a precision pump could be used to force fluid into the micro-cantilever and control delivery to the printing surface.

In the capped fluidic micro-cantilever design, a thin (about 5 to about 25 microns thick) capping layer of SU8 can be added to the micro-cantilever to fully-enclose the fluidic channel. In this embodiment, a fluid access port is left above the reservoir portion of the micro-cantilever device to allow for fluidic connections to be made. Tubing or other fluid connectors may be attached to the access port to control fluid delivery into and out of the groove in the micro-cantilever.

Figure 10:
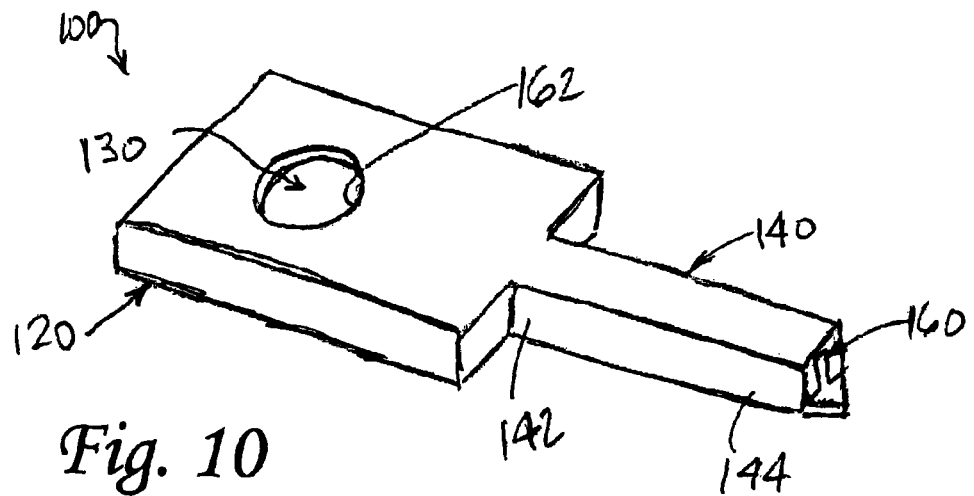
FIGS. 10 is a perspective view of another embodiment of a polymer-based micro-cantilever having an closed passageway or closed channel for ultra-low volume fluid and cell deposition in accordance with the present invention.
Figure 11:
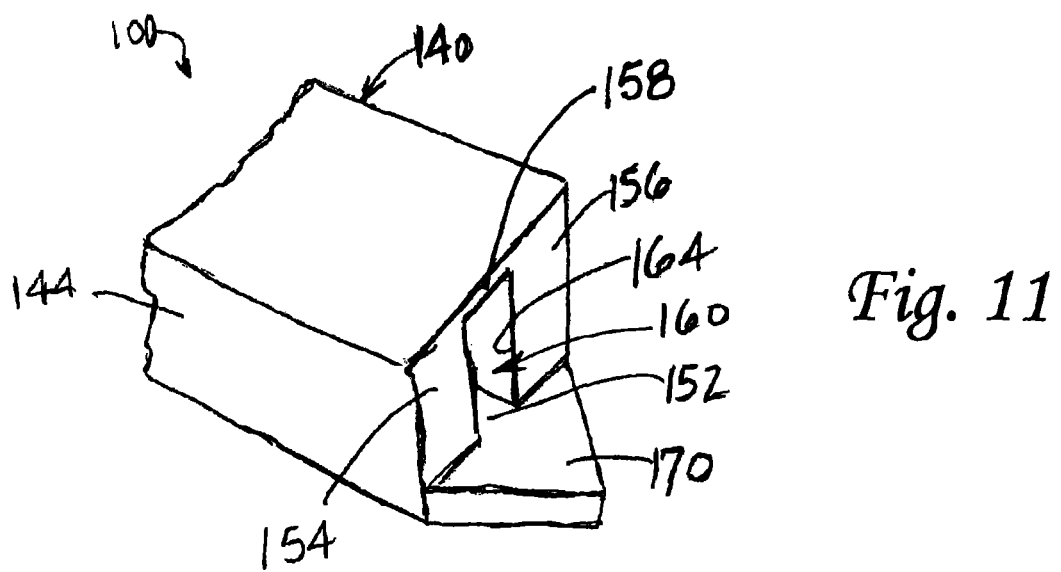
FIG. 11 is an enlarged perspective view of the distal end of the elongated beam of the polymer-based micro-cantilever of FIG. 10.

For example, FIGS. 10 and 11 illustrate an embodiment of a polymer-based micro-cantilever 100 having a closed passageway for depositing material onto a surface in accordance with the present invention. In this exemplary embodiment, polymer-based micro-cantilever 100 may include a body portion 120 (FIG. 10), an elongated beam portion 140 sized smaller than and extending from body portion 120. Body portion 120 includes a reservoir 130 (FIG. 10) disposed in and defined by body portion 120. As described in greater detail below, the body portion and the elongated beam portion may be formed from suitable polymeric materials.

Elongated beam portion 140 includes a passageway 160 disposed therein. Passageway 160 has an inlet opening 162 (FIG. 10) disposed adjacent to reservoir 130 which is in fluid communication with reservoir 30 and an outlet opening 164 (FIG. 11) at a distal end 144 of elongated beam portion 140.

Passageway 160 is closed between inlet opening 162 (FIG. 10) and outlet opening 164 (FIG. 11) forming a closed passageway for transporting fluid from reservoir 130 (FIG. 10) through the body and a proximal end 142 (FIG. 10) of elongated beam 140 to distal end 144 of elongated beam 140.

With reference to FIG. 11, elongated beam 140 may comprise a bottom wall 152, a first sidewall 154, a second sidewall 156, and a cover or upper wall 158. The sidewalls may have a thickness of between about 20 microns and about 100 microns, and the cover may have a thickness of between about 5 microns and about 25 microns. A projecting portion 170 may extend outwardly from distal end 144. The projecting portion may comprise a triangular shape. It will be appreciated that other shapes may be suitably employed. For example, the projecting portion may have a semi-circular shape or other shape.

The body portion and the elongated beam portion may comprise a thickness of between about 50 microns to about 200 microns, and the elongated beam may comprise a length greater than about 500 microns. The passageway may comprise a width greater than 10 microns to about 100 microns, and a height of about 25 microns to about 100 microns. In other embodiments, the passageway may comprise a width of between about 40 microns and 60 microns, and a height of between about 40 microns and 60 microns. In still other embodiments, the passageway may comprise a width of greater than 50 microns to about 100 microns, and a height of greater than 50 microns to about 100 microns. In further embodiments, the elongated beam may comprise a length greater than 2,000 microns, or a length greater than about 3,000 microns.

For example, the polymer-based micro-cantilever may be fabricated using a number of methods. A first method may include photolithographic patterning of SU8 photoresist (an epoxy-based, negative photoresist manufactured and available from Microchem Inc., Newton, Mass.). A second method may include liquid molding of polyurethane in silicone rubber molds. Both fabrication techniques result in the creation of polymer-based micro-cantilevers that can contain a covered passageway within the cantilever. The polymer-based micro-cantilevers can be manufactured in a wide range of sizes. In addition, other methods for forming the polymer-based micro-cantilevers in accordance with the present invention may be employed.

Fabrication of polymer-based micro-cantilevers in accordance with the present invention, may be about 50 to about 200 microns thick, about 100 to about 200 microns wide, and about 500 to about 2000 microns long. The channels formed in the cantilevers may be about 25 to about 100 microns wide and about 25 to about 100 microns deep or high. The channels may be connected to a fluid reservoir that is about 2 mm in diameter and about 25 to about 100 microns deep.

For example, a process or method for creating channels in SU8 cantilevers may employ the following steps:

1. Spin coat Omnicoat (as release layer) on substrate. Softbake to cure layer.
2. Spin coat thin layer of SU8 (SU8 25) and soft bake to cure.
3. Expose layer with mask defining the base of the cantilever. Post exposurebake to crosslink the SU8 film.
4. Spin on a thicker layer of SU8 (SU8 50/100) and soft bake to cure.
5. Expose layer to define the channel walls. Post exposurebake to crosslink the layer. Note that the unexposed material is still sensitive to light.
6. Use a short exposure and short post exposure bake in order to form the channel covering. Cool to room temperature.
7. Develop final structure in SU8 developer and release from substrate.

Figure 12:
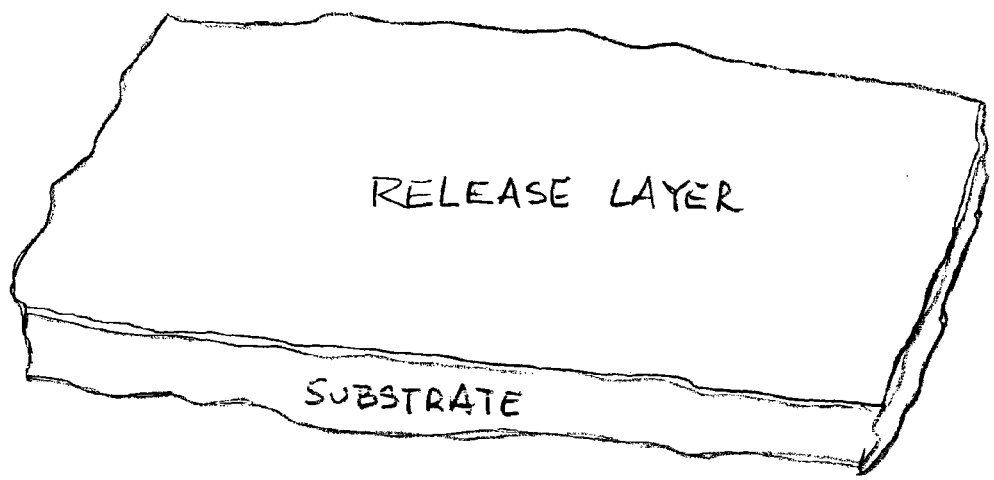
FIGS. 12-18 are perspective views of the process steps for forming the polymer-based micro-cantilever of FIG. 10 having a covered passageway.

For example, a substrate may include a 200-mm silicon wafer <100> which is cleaned in a mixture of hydrogen peroxide and sulfuric acid (volume ratio 1:3) for 2 min, followed by a thorough rinse of deionized (DI) water and blow dry. The substrate is then treated with a release layer or coat such as a spun coated Omnicoat, and softbaked to cure the release layer as shown in FIG. 12.

Figure 13:
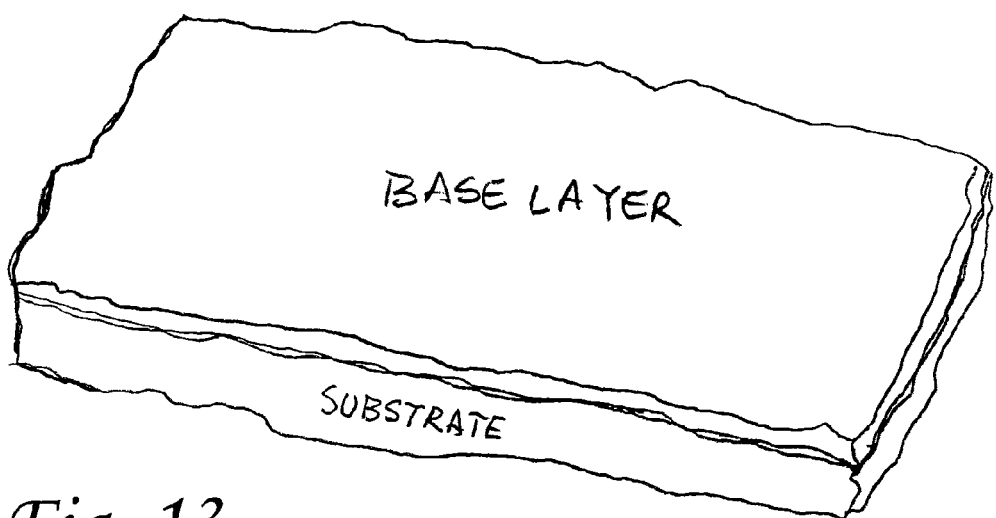

With reference to FIG. 13, a first polymer layer or base layer is deposited. For example, about a 20 to 50 µm SU8 film is spun coated on to the release layer, which is subsequently soft baked in a two-step process, with a final bake temperature of 95° C. for 30 minutes to drive off any residual solvents. The SU8 film forms the base of the polymer-based micro-cantilever.

Figure 14:
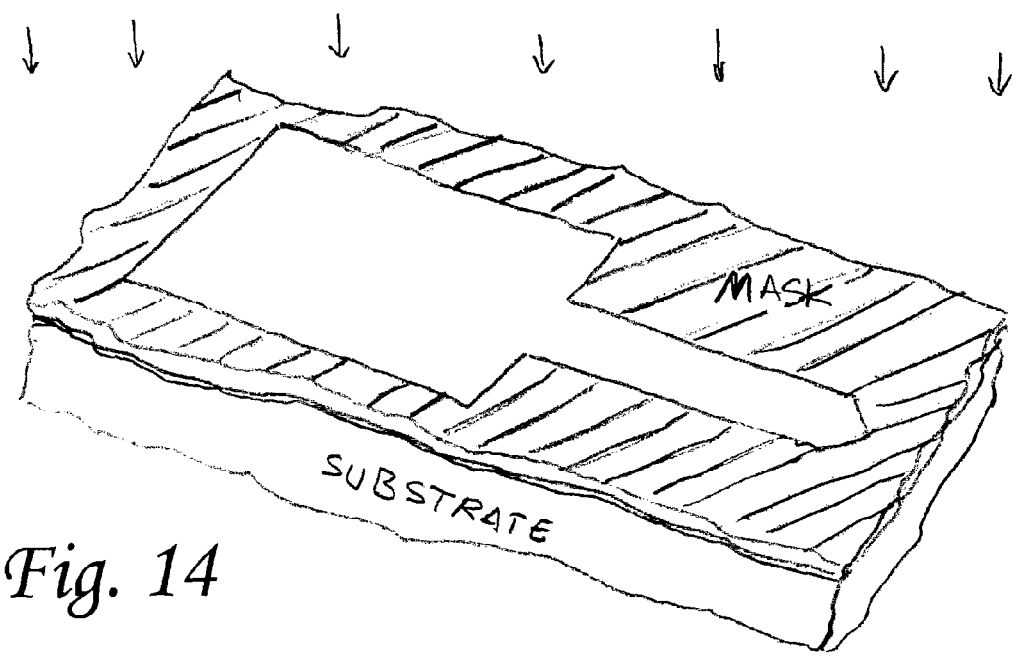

Using a mask having an opening defining the shape of the base of the polymer-based micro-cantilever, as shown in FIG. 14, the SU8 film is exposed (about 500 mJ/cm$^2$) to define the shape of the base, then postexposure baked using a two-step process, with a final bake of 95° C. for 35 min with a natural cool down. This process cross-links the field defining the base while leaving the SU8 outside the base unexposed and uncross-linked.

Figure 15:
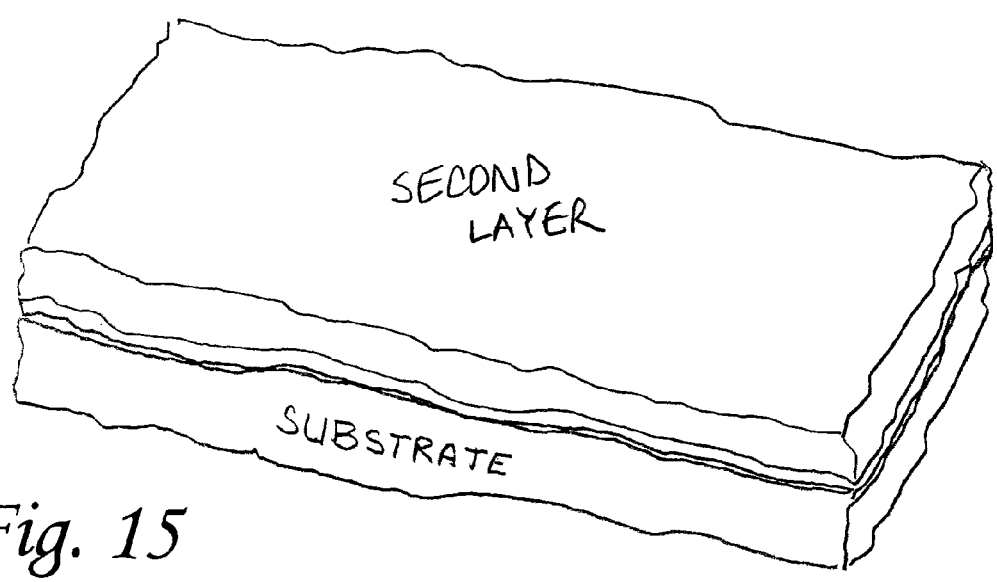

A second polymer layer is deposited onto the first polymer layer as shown in FIG. 15. For example, a second 100 µm SU8 polymer layer is spun coated onto the base layer, and soft baked.

Figure 16:
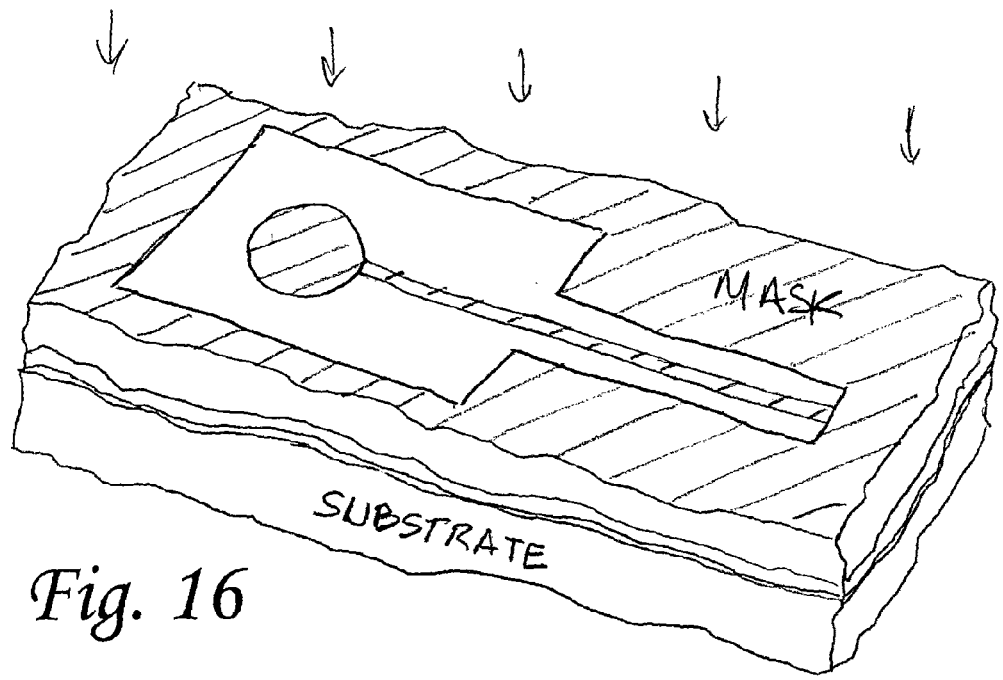

Using a mask having an opening defining the shape of the base of the polymer-based micro-cantilever and defining the reservoir and passageway, as shown in FIG. 16, the second polymer layer is then exposed (about 500 mJ/cm$^2$) first to define the passageway and reservoir and postexposure baked in a two-step process, with a final bake at 95° C. for 35 minutes, cross-linking the field. Although the films have been exposed and baked a number of times, the passageway and reservoir are still filled with unexposed and uncross-linked SU8.

Figure 17:
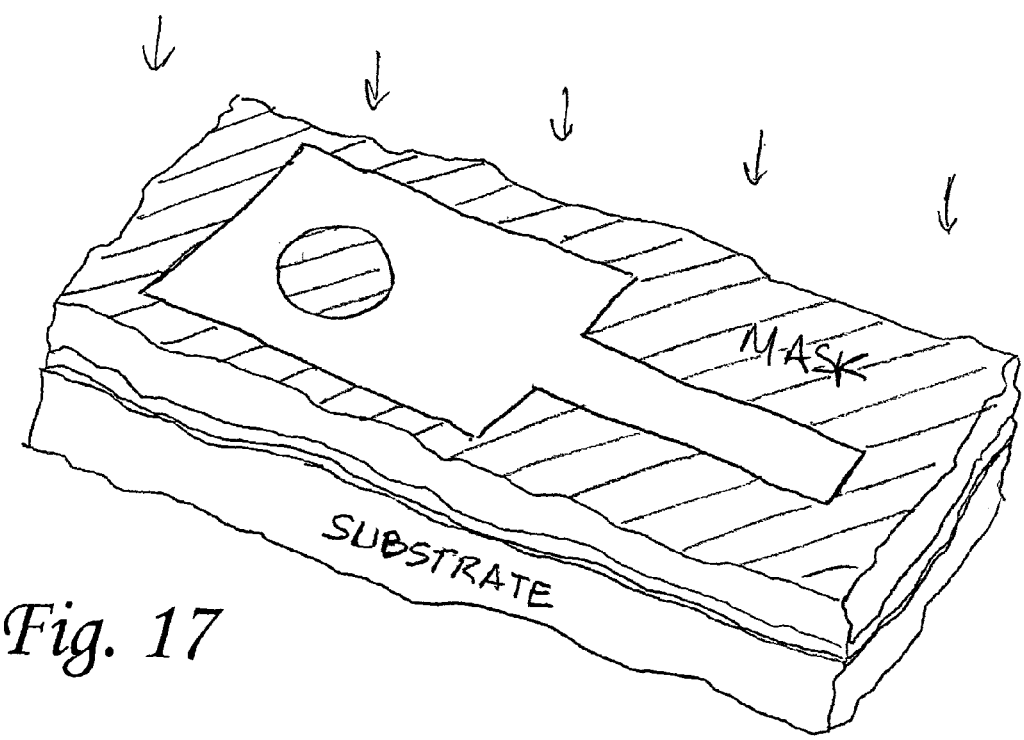

To form the covering, two short exposures (about 69.3 and about 36 mJ/cm$^2$, respectively) and baked at 95° C. for 7 minutes are used as shown in FIG. 17.

Figure 18:
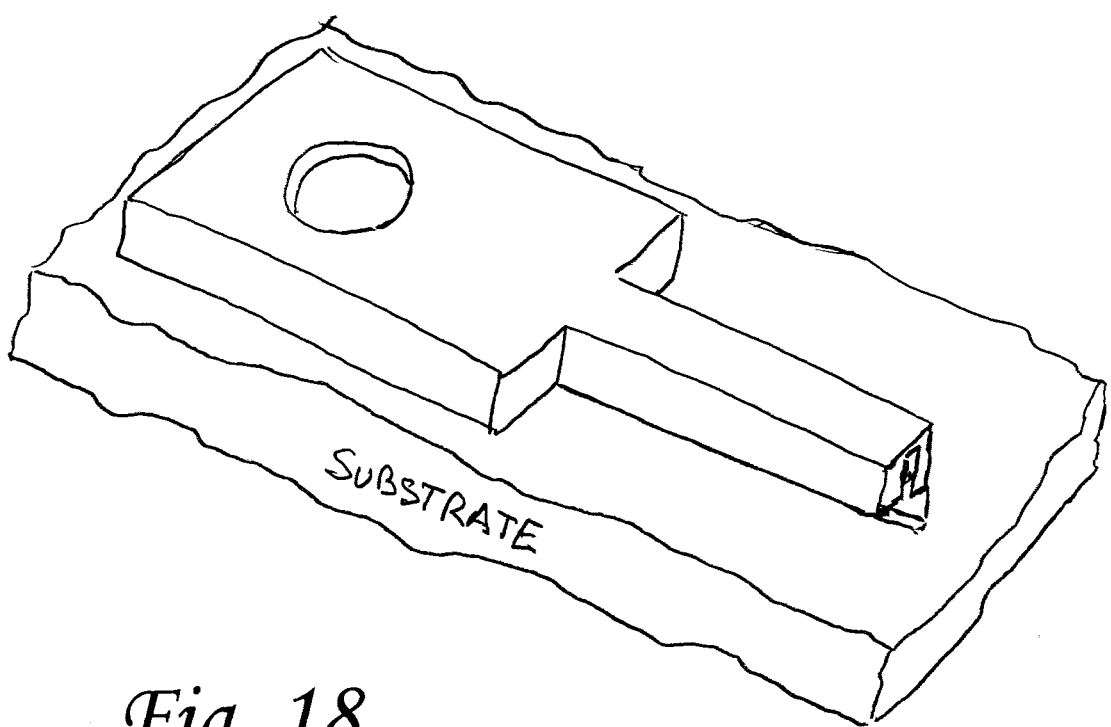

The next step of the process is to develop the layers in polygycol methyletheracetate (PGMEA), gently agitating the bath, dissolving the unexposed SU8 from inside the closed passageway and in the reservoir resulting in the polymer-based micro-cantilever disposed on the substrate as shown in FIG. 18. The polymer-based micro-cantilever may then be removed from the substrate. It will be appreciated that the covering layer may extend over a portion or all of the reservoir.

It will be appreciated that a plurality of the above-described polymer-based micro-cantilevers may be formed at the same time on the substrate as well as the body having a plurality of elongated beams extending therefrom. Further embodiments may include the body not having a reservoir but instead an open or closed channel which extends from the end of the elongated beam to the body or rear portion of the body. As discussed below, a pump or vacuum may be operably connected to the open or closed passageway.

Figure 19:
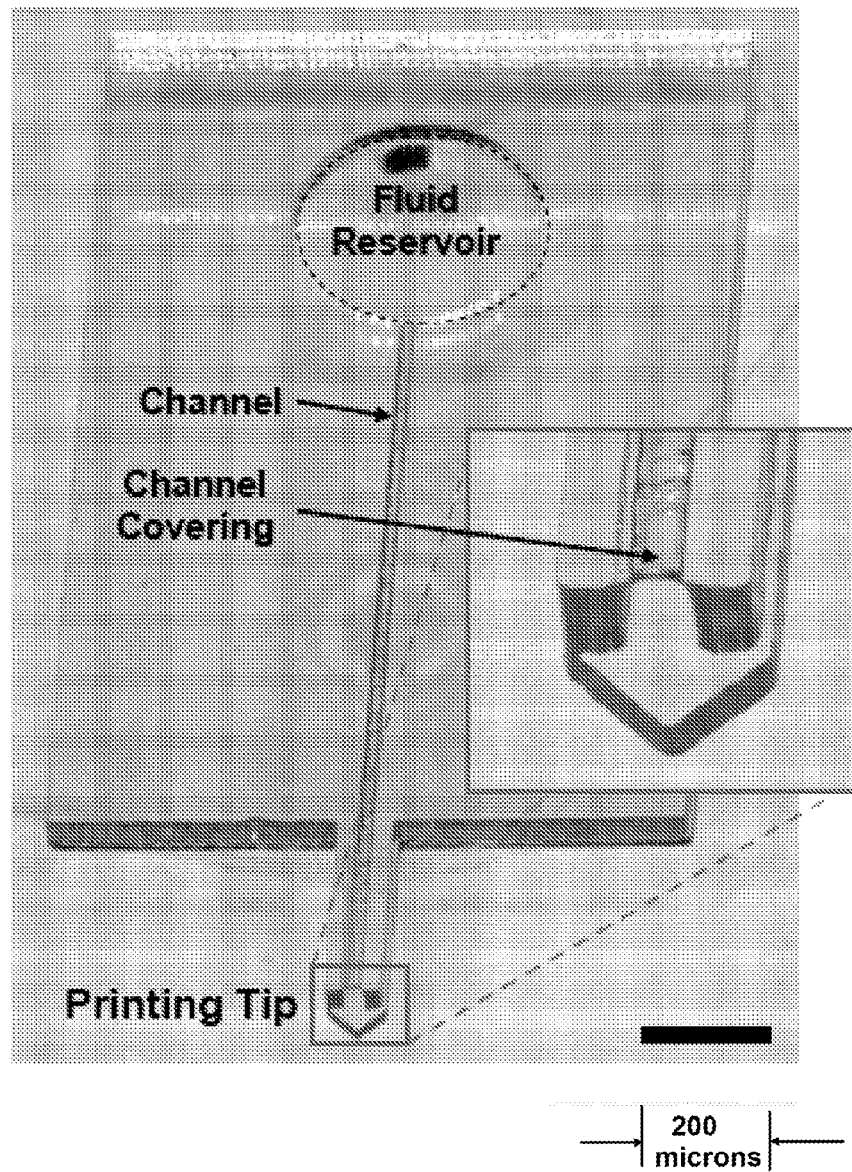
FIG. 19 is an optical micrograph of the polymer-based micro-cantilever of FIG. 10 with an inset showing an enlarged view of the tip region.

FIG. 19 is an optical micrograph of the polymer-based micro-cantilever printing tip. The inset shows an enlarged view of the tip region, with an intact capping layer/cover. The scale bar is 200 microns.

Figure 20:
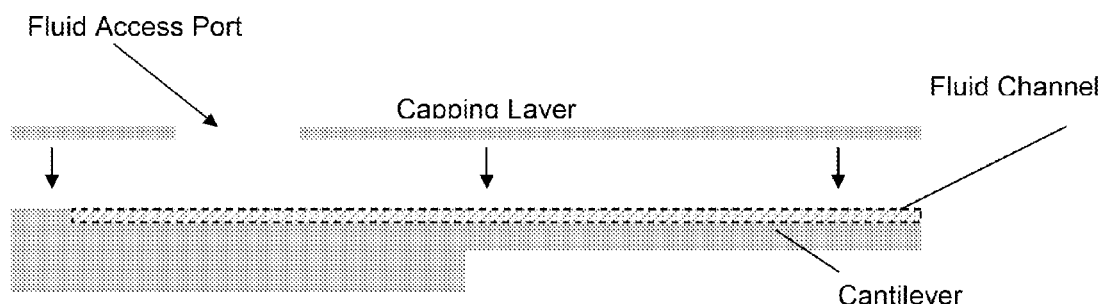
FIG. 20 is a schematic side elevational view of another embodiment of a polymer-based micro-cantilever in accordance with the present invention.

FIG. 20 is a schematic side elevational view of another embodiment of a polymer-based micro-cantilever in accordance with the present invention. A fluid channel and an optional capping layer may be employed.

Figure 21:
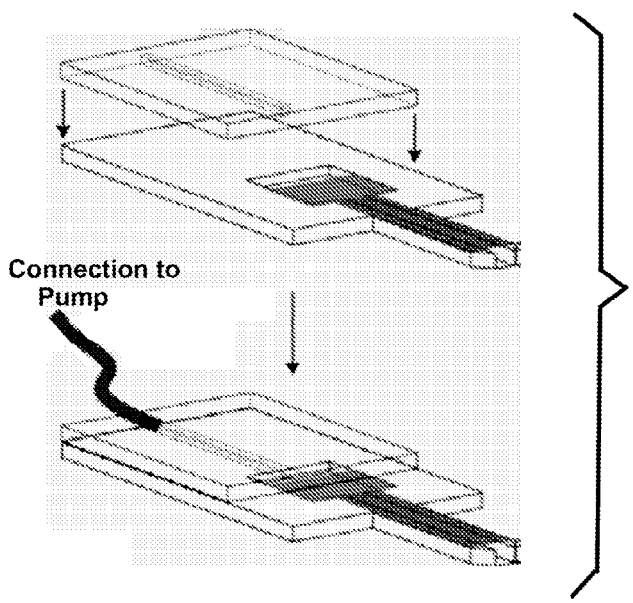
FIG. 21 are perspective views of another embodiment of a polymer-based micro-cantilever having a sealed sample reservoir coupled to a syringe pump or other microfluidic pumping device in accordance with the present invention.
Figure 22:
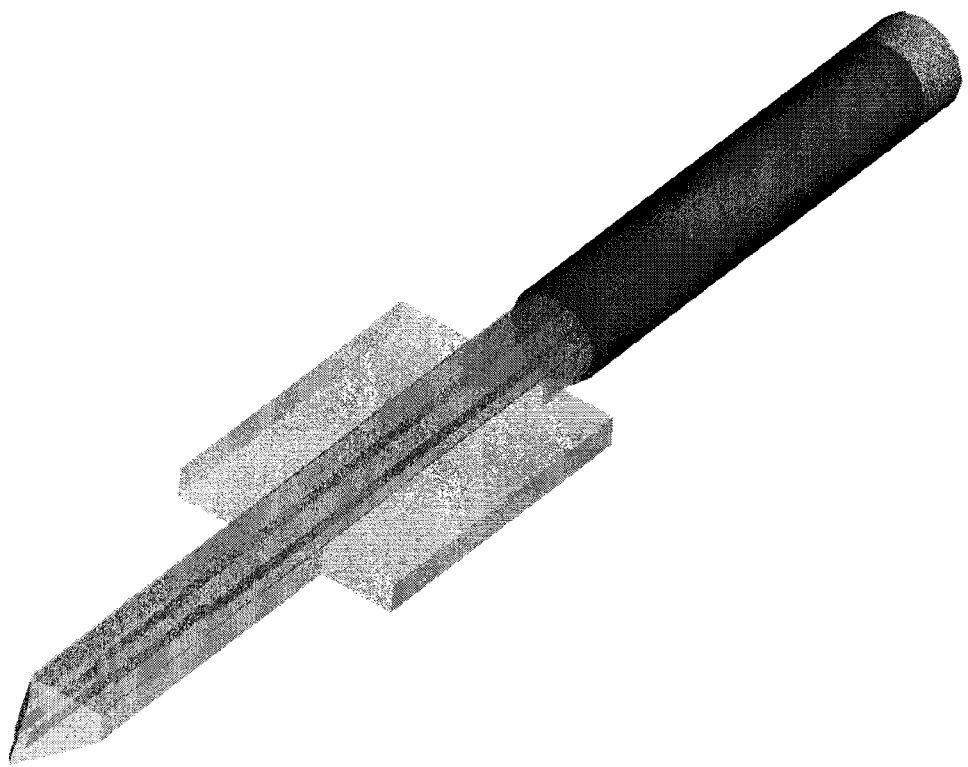
FIG. 22 is another embodiment of a polymer-based micro-cantilever connected to a pump or vacuum source in accordance with the present invention.

FIG. 21 is an embodiment of a microfluidic tubing connection to pump or vacuum source. For example, the micro-cantilever design may incorporate active control over forward/reverse microfluidic flow, such as being connected to a pumping and/or vacuum system controlled manually or by for example, a controller, such as a micro controller, a processor or a computer. An active microfluidic control system design may enable pressure and vacuum based deposition and manipulation of fluid or cells. Further, fabrication of covered fluidic channels enables the ability to integrate active flow control to the device. This can be realized by sealing the sample reservoir with a polymeric PDMS membrane containing microfluidic channels for coupling to a syringe pump or other microfluidic pumping device as shown in FIG. 22. Active flow integration would enable cell delivery or withdrawal and manipulation using a single device.

To enable active flow, the capped micro-cantilevers could be connected to a pressure-based pumping system, such as a syringe pump, or a vacuum based withdrawing system, to enable forcible expulsion, or withdrawal of fluids from the micro-cantilever tip. Pressure-based expulsion of fluids would enable printing on non-wetting (hydrophobic) surfaces. Fluid withdrawal from the surface, using vacuum-based fluid control, would enable precision capture of materials from surfaces, including capture and repositioning of cells.

The ability to directly control and manipulate the position of cells on solid surfaces may allow investigation of cell-to-cell signaling/communication, cell-surface interactions, and directly interface with cells with nanodevices and biosensors. The positioning of cells in defined patterns with control of cell density and proximity facilitates complex studies of cellular communication, signaling, material interactions, and tissue engineering. These parameters may be important for signaling within cellular networks (e.g. neural networks), for communication between cells (e.g. bacterial quorum sensing), and for tissue morphogenesis and stem cell development. Direct placement of cells onto chemically and topographically defined surfaces enables elucidation of cell-surface and cell-cell interaction mechanisms and may benefit the creation of hybrid nanodevices and biosensors.

Currently available cell deposition technologies include both direct and indirect methods which have varying capability to control the positioning of individual cells and ensure cellular viability after patterning. The present invention is directed to a versatile cellular deposition device that can print a controlled number of cells (potentially down to single-cell resolution) with micrometer precision. The polymer-based micro-cantilever based technology of the present invention offers a unique combination of integrated microfluidics, high spatial resolution/alignment, and compatibility with a wide range of biological materials. The polymer-based micro-cantilever printing approach exerts minimal fluid shear in isothermal conditions, provides a low-stress positioning/manipulation method compared to other direct cell patterning techniques. Furthermore, the polymer-based micro-cantilever printing apparatus and method may enable precise spatial positioning of controlled numbers of bacteria and mammalian cells, while maintaining high cell viability after deposition.

Figure 23:
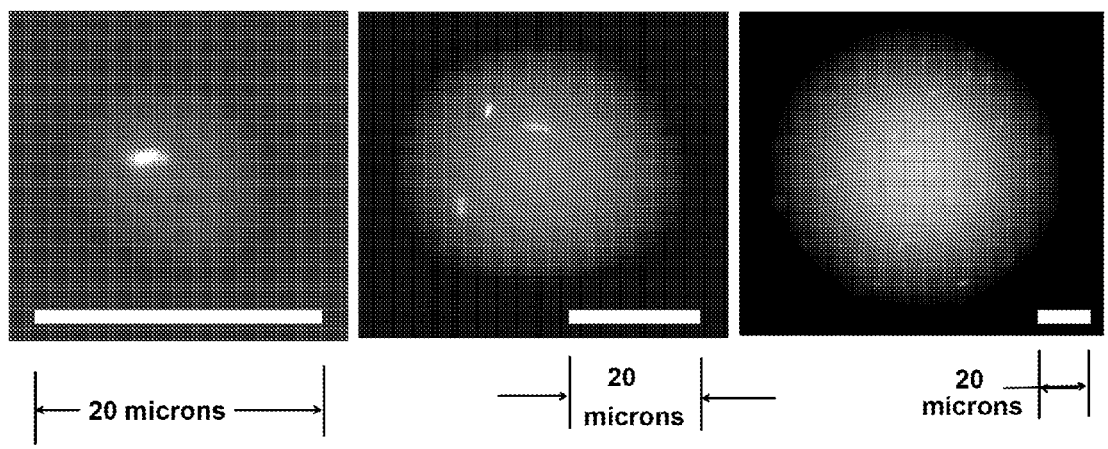
FIG. 23 are images of liquid droplets printed with the polymer-based micro-cantilever of FIG. 1 in which the droplets contain live bacterial cells (*E. coli* expressing the green fluorescent protein)

Preliminary work with the grooved, polymeric polymer-based micro-cantilevers has demonstrated successful printing of live bacterial and mammalian cells onto solid surfaces. Bacterial cells (*E. coli*) in 10% glycerol solution were loaded into the reservoir region of the grooved cantilevers and inserted into a BioForce Nano eNabler instrument for printing. The Nano eNabler instrument can control the X and Y movements of the substrate to be printed (in this case a glass slide) and can control the height of the cantilever above this surface. Using the instrument, liquid droplets containing bacteria were printed onto glass and polystyrene surfaces. The size of the droplets may be controlled by varying the contact time between the cantilever and the surface, as well as the vertical distance between the cantilever and the surface prior to making contact. It was possible to achieve spot sizes between about 20 μm and about 100 μm in diameter with approximate volumes ranging from 1 to 250 μL. The live bacterial cells could be visualized in these droplets using fluorescence microscopy as shown in FIG. 23. The number of cells in the droplet was dependent upon the size of the droplet, but could also be varied by adjusting the number of cells present in the initial fluid solution.

Figure 24:
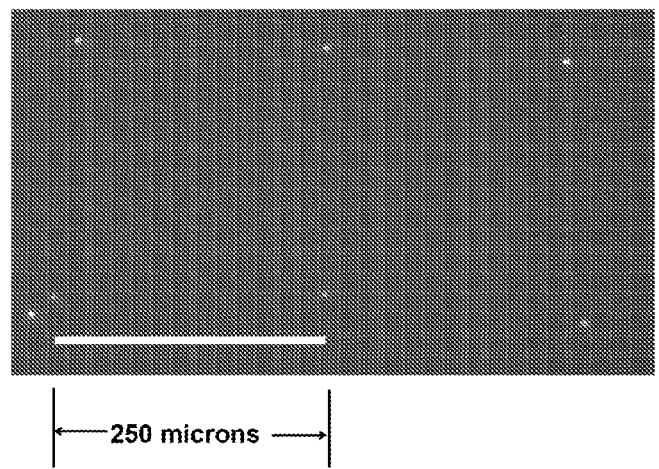
FIG. 24 is an image of cells within the droplets that were adhered to a glass surface using fluorescence microscopy.

The attachment of cells to surfaces using grooved polymer-based micro-cantilevers was also demonstrated. Cells in 10% glycerol solution were printed onto glass slides that had been previously modified to present an aldehyde chemical group at their surface (Eerie Scientific SuperAldehyde Slides). After printing droplets on the slide, the droplets were allowed to incubate for 1 hour and were then washed with water. As can be seen in FIG. 24, cells within the droplets were adhered to the glass surface and could be visualized using fluorescence microscopy. This demonstrates the utility of grooved polymer-based micro-polymeric cantilevers for precision deposition of cells onto solid surfaces. The technique may be used for directly patterning a wide range of cell types onto various surfaces. This may be useful for both microbiological research (with bacteria) as well as for eukaryotic (mammalian, plant, etc.) cell research where precise cell patterning is desired. Individual bacterial cells (*E. coli*) may be patterned onto an aldehyde-modified glass surface using grooved polymer-based micro-cantilevers. Cells were deposited in liquid droplets and were bonded to the surface through the aldehyde functionality. After rinsing with water, cells remained attached to the surface in the original grid pattern.

Figure 25:
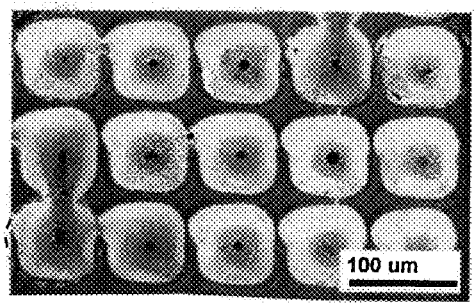
FIG. 25 illustrates printed of mammalian cells.

The printing of mammalian cells have been demonstrated with this system, as shown in FIG. 25. Human HT1080 fibrosarcoma cells in DMEM/FBS were mixed with glycerol to obtain a 10% v/v glycerol solution and then printed onto polystyrene surfaces using the present invention. Single cells may be deposited into individual droplets (as shown in FIG. 25) while larger droplets containing multiple cells may also be achieved.

Cell printing has also been demonstrated for mammalian cells, including mouse MTLn3 cells and mouse embryonic stem cells. Mammalian cells in 10% glycerol solution were printed onto glass slides and polystyrene tissue culture plates similar to the bacterial printing experiments described above.

Figure 26:
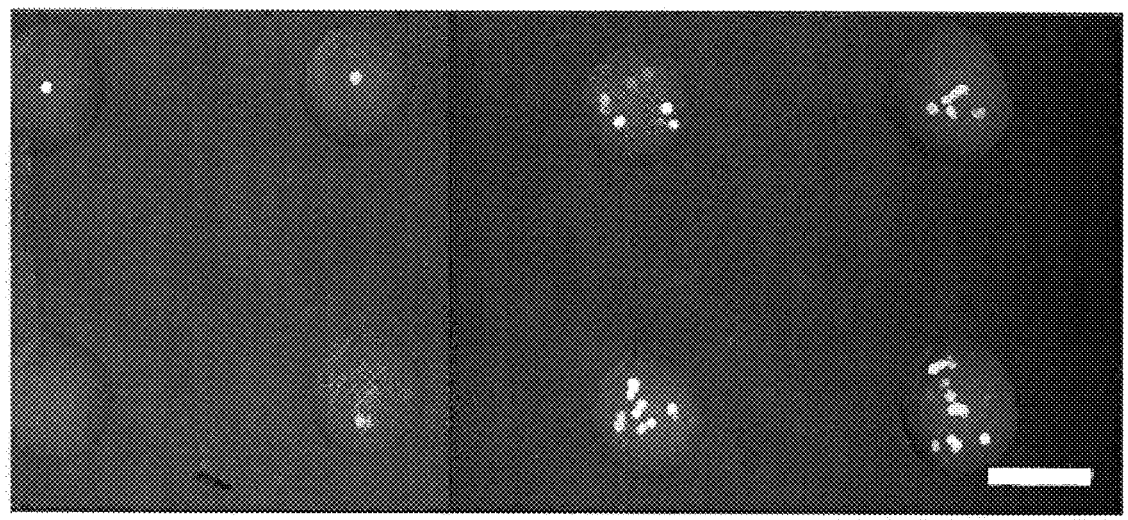
FIG. 26 is an image of liquid droplets printed with the polymer-based micro-cantilever of FIG. 1 in which the droplets contain live mammalian cells (mouse MTLn3 cells expressing the green fluorescent protein)

FIG. 26 shows printed spots containing MTLn3 cells that were expressing the green fluorescent protein. The number of cells per spot may be controlled by varying the initial concentration of cells in the printing solution. The left-most portion of FIG. 26 shows spots containing individual cells, printed from a solution containing a low concentration of cells. The right-most portion of FIG. 26 shows spots containing multiple cells, which were printed from a solution containing a 10-fold higher concentration of cells.

Advantages of the present invention include the improved manufacturability and surface properties of the polymeric materials (as compared to silicon-based systems) and the ability to fully enclose grooved cantilevers for more controlled fluid delivery. Initial testing has also demonstrated that living cells can be patterned onto surfaces using polymer-based micro-cantilevers, which is not possible using traditional silicon-based cantilevers. The use of polymeric materials simplifies the manufacturing process and also reduces the cost of manufacturing. Both photolithographic and molding technologies may be further explored for manufacturing polymeric cantilevers, and further extending manufacturing options. In addition, the surface properties of the SU8 polymer enable the use of grooved cantilevers for printing with minimal surface pre-treatment. For example, simple dipping in Pluronic F-127 and very short UV/ozone treatment may be applied to the micro-cantilever polymeric material.

Figure 27:
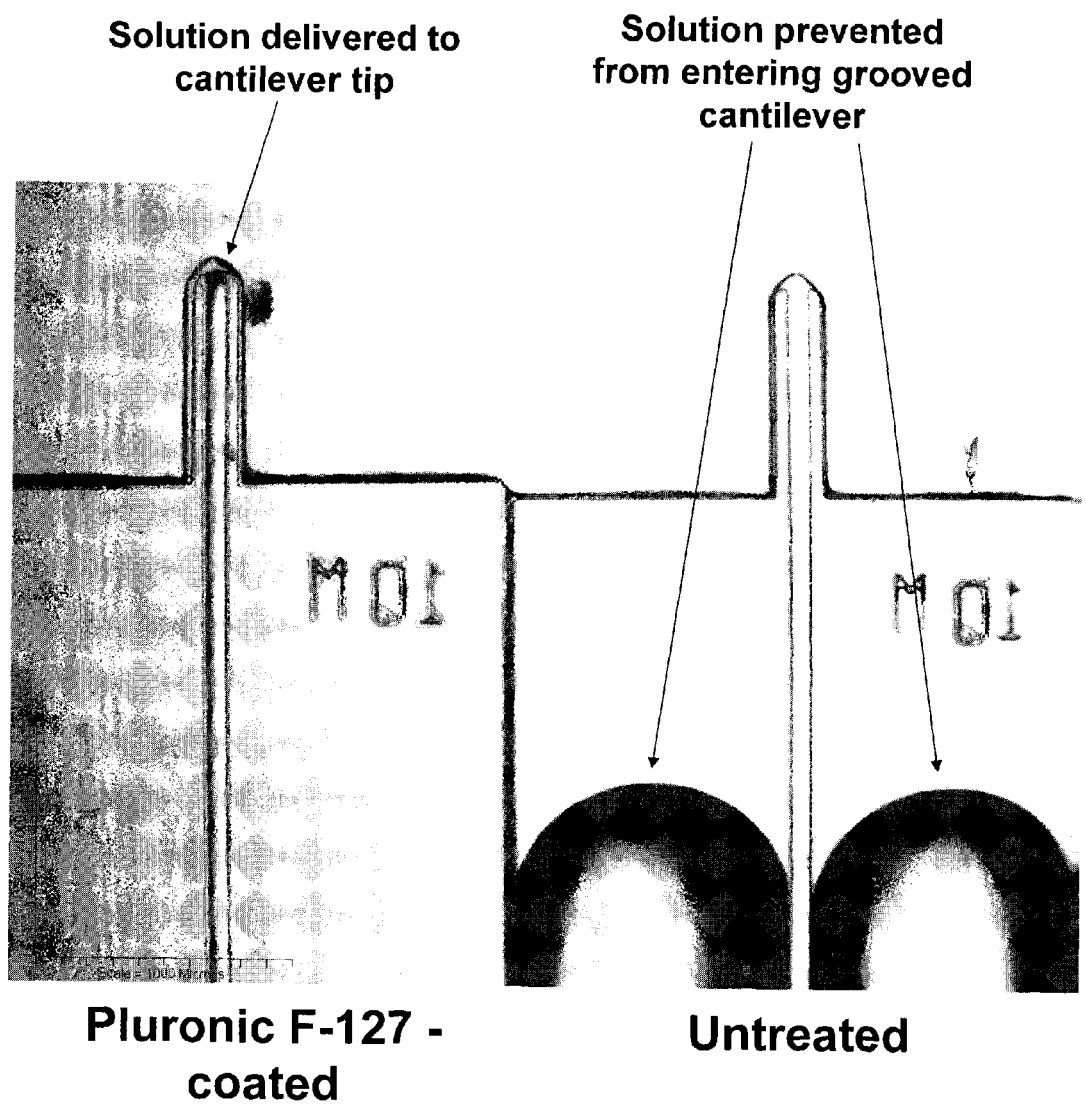
FIG. 27 is an image of two polymer-based micro-cantilevers treated with a wetting agent, Pluronic F-127 (left) or untreated (right).

FIG. 27 shows a polymer-based micro-cantilever treated with Pluronic F-127 and an un-treated micro-cantilever. A water-based printing solution may be delivered to the printing tip for the Pluronic F-127 coated micro-cantilever, whereas the solution was inhibited from entering the micro-cantilever channel, if left untreated.

It will be appreciated that in the configuration of the micro-cantilever having a cap and an enclosed passageway in accordance with the present invention, and the deposition of fluid or cells form the covered fluidic channel may eliminate the need for glycerol or additives, e.g., that lower vapor pressure of the liquid.

As noted above, it will be appreciated that the micro-cantilever for delivering fluid and/or cells may comprise a body and a plurality of elongated potions having a channel or an enclosed passageway. Such a configuration may permit simultaneous deposition of a plurality of fluid droplets or cell at a time.

Thus, while various embodiments of the present invention have been illustrated and described, it will be appreciated to those skilled in the art that many changes and modifications may be made thereunto without departing from the spirit and scope of the invention.

The invention claimed is:

1. A device for depositing material onto a surface, said device comprising:
    a body portion;
    an elongated beam portion sized smaller than and extending from said body portion, said elongated beam portion comprising a length greater than about 500 microns;
    said body portion having a reservoir disposed in said body portion;
    said elongated beam portion having a passageway disposed therein, said passageway having an inlet opening in fluid communication with said reservoir and an outlet opening at a distal end of said elongated beam portion, and said passageway comprising a width greater than 10 microns to about 100 microns, and a height of about 25 microns to about 100 microns; and
    wherein said passageway being an enclosed fluidic passageway extending between said inlet opening and said outlet opening for transporting fluid from said reservoir to said distal end of said elongated beam portion.

2. The device of claim 1 wherein said elongated beam portion comprises a bottom wall, a first side wall, a second side wall, and an upper wall extending across said passageway having a thickness of between about 5 microns and about 25 microns.

3. The device of claim 1 wherein said body portion and said elongated beam portion comprise a polymeric material.

4. The device of claim 1 wherein said passageway comprises a width of between about 40 microns and 60 microns, and a height of between about 40 microns and 60 microns.

5. The device of claim 1 wherein said passageway comprises a width of greater than 50 microns to about 100 microns, and a height of greater than 50 microns to about 100 microns.

6. The device of claim 1 wherein said body portion and said elongated beam portion comprise a thickness of between about 50 microns to about 200 microns.

7. The device of claim 1 further comprising a projecting portion extending below said distal opening at the distal end of said elongated beam portion and outwardly from said distal end.

8. The device of claim 7 wherein said projecting portion comprises at least one of a triangular and a semi-circular shape.

9. The device of claim 1 wherein said elongated beam portion comprises a length greater than 2,000 microns.

10. The device of claim 1 wherein said elongated beam portion comprises a length greater than about 3,000 microns.

11. A method for delivering a fluid to a surface, the method comprising:
    providing the device of claim 1;
    introducing the fluid into the reservoir of the device;
    transferring fluid through the passageway from the reservoir to the distal end of the elongated beam portion; and
    depositing the fluid from the distal end of the elongated beam portion to the surface.

12. The method of claim 11 wherein the depositing the fluid comprises positioning the elongated beam portion on an angle relative to the surface.

13. The method of claim 11 wherein the depositing fluid comprises positioning the elongated beam portion on an angle of about 36 degrees to about 48 degrees relative to the surface.

14. The method of claim 11 wherein the depositing the fluid comprises depositing a droplet of fluid to the surface wherein the droplet comprises a diameter of about 10 microns to about 100 microns.

15. The method of claim 11 wherein the depositing the fluid comprises depositing a droplet of fluid to the surface wherein the droplet comprises a diameter of about 50 microns.

16. The method of claim 11 wherein the depositing the fluid comprises depositing a droplet of fluid to the surface wherein the droplet comprises a diameter of about 100 microns.

17. A method for delivering living cells to a surface, the method comprising:
    providing the device of claim 1;
    depositing the cells into the reservoir of the device;
    transferring the cells through the passageway from the reservoir to the distal end of the elongated beam portion; and
    depositing the cells from the distal end of the elongated beam portion to the surface.

18. The method of claim 17 wherein the cells comprise at least one of mammalian, plant, fungal, and bacteria cells.

19. The method of claim 17 wherein the depositing the cells comprises depositing a single cell at spaced-apart locations.

20. The method of claim 17 wherein the depositing the cells comprises depositing cells at uniformly spaced-apart locations.

21. The method of claim 17 wherein the depositing the cells comprises depositing cell in columns and rows.

22. A method for delivering fluid to a surface, the method comprising:
providing the device of claim 1 comprising the elongated beam portion having the passageway therein;
transferring the fluid through the passageway to the outlet opening in the distal end of the elongated beam portion; and
depositing the fluid from the distal end of the elongated beam portion to the surface to provide a plurality of droplets having a diameter of between about 20 microns to about 100 microns.

23. The method of claim 22 wherein the depositing the fluid comprises transferring a droplet of fluid to the surface having volume between about 1 pL to about 250 pL.

24. The method of claim 22 wherein the depositing the fluid comprises transferring a droplet of fluid to the surface wherein the droplet comprises a diameter of about 50 microns.

25. The method of claim 22 wherein the depositing the fluid comprises transferring a droplet of fluid to the surface wherein the droplet comprises a diameter of about 100 microns.

26. The method of claim 22 wherein the depositing the fluid comprises depositing the fluid from a projecting portion extending outwardly from the distal end of the elongated beam portion.

27. The method of claim 22 further comprising providing a pump operably connected to the elongated beam portion for delivering fluid to the distal end.

28. The method of claim 22 further comprising a vacuum device operably connected to the elongated beam portion for removing fluid from the surface.

29. The device of claim 1 wherein the device is formed by a method comprising:
providing a substrate;
depositing a release layer on the substrate;
depositing a first polymeric layer on a substrate;
exposing the first polymeric layer to a light source to define a base of the body portion and the elongated beam portion extending from the body portion;
depositing a second polymeric layer on the first polymeric layer;
exposing the second polymeric layer to the light source to define an upper portion of the body portion having the reservoir, and a plurality of spaced-apart walls defining an upper portion of the elongated beam portion extending from the body portion and terminating at the distal end of the elongated beam portion, and a passageway extending from the reservoir between the spaced-apart walls to the distal end of the elongated beam portion;
exposing the second polymeric layer to the light source to define a cover disposed over the passageway extending from the reservoir, between the spaced-apart walls, and to the projection portion; and
developing the second polymeric layer to dissolve the unexposed portions of the polymeric layers.

30. The device of claim 29 wherein the cover disposed over the passageway comprises a thickness of between about 5 microns and about 25 microns.

31. The device of claim 29 wherein the projecting portion comprises at least one of a triangular and a semi-circular shape.

32. The device of claim 29 wherein the enclosed passageway comprises a width of about 25 microns to about 100 microns.

33. The device of claim 29 wherein the enclosed passageway comprises a height of about 25 microns to about 100 microns.

34. The device of claim 29 wherein the elongated beam portion comprises a width of about 100 microns to about 200 microns.

35. The device of claim 29 wherein the length of the elongated beam portion is about 500 microns to about 2000 microns.

36. The device of claim 29 wherein the length of the elongated beam portion is greater than 2000 microns.

37. The device of claim 29 wherein the polymeric material comprises SU8.

38. A device for depositing material onto a surface, said device comprising:
a body portion;
an elongated beam portion sized smaller than and extending from said body portion, said body portion and said elongated beam portion comprising a thickness of between about 50 microns to about 200 microns, and said elongated beam portion comprising a length greater than about 500 microns;
said body portion having a reservoir disposed in said body portion;
said elongated beam portion having a passageway disposed therein, said passageway having an inlet opening in fluid communication with said reservoir and an outlet opening at a distal end of said elongated beam portion, said passageway comprising a width greater than 10 microns to about 100 microns, and a height of about 25 microns to about 100 microns, and said elongated beam portion comprising a bottom wall, a first side wall, a second side wall, and an upper wall defining an enclosed fluidic passageway between said inlet opening and said outlet opening for transporting fluid from said reservoir to said distal end of said elongated beam portion;
a projecting portion extending below said distal opening at the distal end of said elongated beam portion outwardly from said distal end; and
wherein said body portion and said elongated beam portion comprise a polymeric material.

39. The device of claim 38 wherein said upper wall extending across said passageway comprises a thickness of between about 5 microns and about 25 microns.

40. The device of claim 38 wherein said passageway comprises having a width of between about 40 microns and 60 microns, and a height of between about 40 microns and 60 microns.

41. The device of claim 38 wherein said passageway comprises a width of greater than 50 microns to about 100 microns, and a height of greater than 50 microns to about 100 microns.

42. The device of claim 38 wherein said projecting portion comprises at least one of a triangular and a semi-circular shape.

43. The device of claim 38 wherein said elongated beam portion comprises a length greater than 2,000 microns.

44. The device of claim 38 wherein said elongated beam portion comprises a length greater than about 3,000 microns.

* * * * *